United States Patent
Yee et al.

(10) Patent No.: US 12,027,361 B2
(45) Date of Patent: Jul. 2, 2024

(54) HIGH TEMPERATURE SUPERCONDUCTOR-BASED INTERCONNECT SYSTEMS WITH A LOWERED THERMAL LOAD FOR INTERCONNECTING CRYOGENIC ELECTRONICS WITH NON-CRYOGENIC ELECTRONICS

(71) Applicant: Microsoft Technology Licensing, LLC, Redmond, WA (US)

(72) Inventors: Dawson Yee, Medina, WA (US); Craig S. Ranta, Olympia, WA (US); Cliff C. Lee, Bellevue, WA (US); Douglas P. Kelley, Sammamish, WA (US); Matthew David Turner, Carnation, WA (US); David B. Tuckerman, Lafayette, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 504 days.

(21) Appl. No.: 17/327,199

(22) Filed: May 21, 2021

(65) Prior Publication Data
US 2022/0375869 A1    Nov. 24, 2022

(51) Int. Cl.
*H03K 19/19* (2006.01)
*H01L 23/532* (2006.01)
(Continued)

(52) U.S. Cl.
CPC ...... *H01L 23/53285* (2013.01); *H01L 27/092* (2013.01); *H03K 19/018521* (2013.01);
(Continued)

(58) Field of Classification Search
CPC ...... H01L 23/53285; H03K 19/018521; H03K 19/195
See application file for complete search history.

(56) References Cited

U.S. PATENT DOCUMENTS 6,562,761 B1 * 5/2003 Fritzemeier ........ H10N 60/0324
                                                501/126
6,673,387 B1 * 1/2004 Zhang ................. C23C 18/1241
                                                427/126.3
(Continued)

OTHER PUBLICATIONS

"International Search Report and Written Opinion Issued in PCT Application No. PCT/US22/026618", dated Oct. 11, 2022, 14 Pages.

(Continued)

*Primary Examiner* — Sherman Ng
(74) *Attorney, Agent, or Firm* — Ranjeev Singh; Singh Law, PLLC (57) ABSTRACT

High temperature superconductor (HTS)-based interconnect systems comprising a cable including HTS-based interconnects are described. Each of the HTS-based interconnects includes a first portion extending from a first end towards an intermediate portion and a second portion extending from the intermediate portion to a second end. Each of the HTS-based interconnects includes a substrate layer formed in the first portion, in the intermediate portion, and in the second portion, a high temperature superconductor layer formed in at least a sub-portion of the first portion, in the intermediate portion, and in the second portion, and a metallic layer formed in the first portion and in at least a sub-portion of the intermediate portion. The HTS-based interconnect system includes a thermal load management system configured to maintain the intermediate portion of each of the HTS-based interconnects at a predetermined temperature in a range between a temperature of 60 kelvin and 92 kelvin.

20 Claims, 5 Drawing Sheets (51) Int. Cl.
    *H01L 27/092*   (2006.01)
    *H03K 19/0185*  (2006.01)
    *H03K 19/195*   (2006.01)
    *H10N 60/12*    (2023.01)
    *H10N 60/80*    (2023.01)
(52) U.S. Cl.
    CPC ........... *H03K 19/195* (2013.01); *H10N 60/12* (2023.02); *H10N 60/805* (2023.02)

(56) References Cited

U.S. PATENT DOCUMENTS

| | | | |
|---|---|---|---|
| 6,828,507 B1 * | 12/2004 | Fritzemeier | C30B 29/16 505/231 |
| 7,816,303 B2 * | 10/2010 | Thieme | H10N 60/203 428/930 |
| 10,141,493 B2 | 11/2018 | Tuckerman | |
| 2002/0144838 A1 | 10/2002 | Fritzemeier et al. | |
| 2008/0194411 A1 * | 8/2008 | Folts | H10N 60/203 505/110 |
| 2009/0233800 A1 * | 9/2009 | Huang | H10N 60/0716 427/63 |
| 2010/0210468 A1 * | 8/2010 | Lee | H10N 60/80 228/199 |
| 2018/0294401 A1 * | 10/2018 | Tuckerman | H10N 60/80 |
| 2020/0194657 A1 * | 6/2020 | Solovyov | H10N 60/0128 |
| 2020/0343652 A1 * | 10/2020 | Falter | H01R 4/68 |

OTHER PUBLICATIONS

Castelvecchi, Davide, "Room-Temperature Superconductor Puzzles Physicists", In Journal of Nature, vol. 586, Oct. 15, 2020, pp. 349.

\* cited by examiner

HIGH TEMPERATURE SUPERCONDUCTOR-BASED INTERCONNECT SYSTEMS WITH A LOWERED THERMAL LOAD FOR INTERCONNECTING CRYOGENIC ELECTRONICS WITH NON-CRYOGENIC ELECTRONICS

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An additional approach to the use of processors and related components, based on CMOS technology, is the use of superconducting logic based devices. Superconducting logic based devices can also be used to process quantum information, such as qubits. Unlike CMOS devices that can operate at room-temperature, superconducting logic based devices require lower temperatures to function properly. In many applications, superconducting logic based devices and CMOS devices may need to be interconnected to each other. Similarly, superconducting logic based modules may need to be interconnected with each other or other modules that may operate at further lower temperatures.

SUMMARY

In one example, the present disclosure relates to a high temperature superconductor (HTS)-based interconnect system comprising a cable including a plurality of HTS-based interconnects for interconnecting cryogenic electronics with non-cryogenic electronics. Each of the plurality of HTS-based interconnects may include a first portion extending from a first end towards an intermediate portion and a second portion extending from the intermediate portion to a second end, opposite to the first end. Each of the plurality of HTS-based interconnects may include a substrate layer formed in the first portion, in the intermediate portion, and in the second portion, a high temperature superconductor layer formed over the substrate layer in at least a sub-portion of the first portion, in the intermediate portion, and in the second portion, and a metallic layer formed over the high temperature superconductor layer in the first portion and in at least a sub-portion of the intermediate portion. The HTS-based interconnect system may further include a thermal load management system comprising at least one heat transfer element coupled to the intermediate portion of each of the plurality of HTS-based interconnects. The thermal load management system may be configured to maintain the intermediate portion of each of the plurality of HTS-based interconnects at a predetermined temperature in a range between a temperature of 60 kelvin and 92 kelvin.

In another example, the present disclosure relates to high temperature superconductor (HTS)-based interconnect for interconnecting cryogenic electronics with non-cryogenic electronics. The HTS-based interconnect may include a first portion extending from a first end towards an intermediation portion and a second portion extending from the intermediate portion to a second end, opposite to the first end. The HTS-based interconnect may further include a substrate layer formed in the first portion, in the intermediate portion, and in the second portion, a high temperature superconductor layer formed over the substrate layer in at least a sub-portion of the first portion, in the intermediate portion, and in the second portion, and a metallic layer formed over the high temperature superconductor layer in the first portion and in at least a sub-portion of the intermediate portion.

In yet another example, the present disclosure relates to a high temperature superconductor (HTS)-based interconnect system comprising a cable including a plurality of HTS-based interconnects for directly interconnecting cryogenic electronics with non-cryogenic electronics such that differential signals are transferrable to or from a first end of the cable to a second end, opposite to the first end, of the cable without converting a form of the differential signals. Each of the plurality of HTS-based interconnects may include a first portion extending from the first end towards an intermediate portion and a second portion extending from the intermediate portion to the second end. Each of the plurality of HTS-based interconnects may comprise a substrate layer formed in the first portion, in the intermediate portion, and in the second portion, a high temperature superconductor layer formed over the substrate layer in at least a sub-portion of the first portion, in the intermediate portion, and in the second portion, and a metallic layer formed over the high temperature superconductor layer in the first portion and in at least a sub-portion of the intermediate portion. The HTS-based interconnect system may further include a thermal load management system comprising at least one heat transfer element coupled to the intermediate portion of each of the plurality of HTS-based interconnects. The thermal load management system may be configured to maintain the intermediate portion of each of the plurality of HTS-based interconnects at a predetermined temperature in a range between a temperature of 60 kelvin and 92 kelvin.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to high temperature superconductor (HTS)-based interconnect systems with a lowered thermal load for interconnecting cryogenic electronics with non-cryogenic electronics. Such HTS-based interconnect systems may include flexible-substrate based interconnects. As an example, such HTS-based interconnect systems may be used to couple modules within a superconducting logic based system that may operate in an approximately 10 kelvin (~10 K) or below thermal environment with CMOS-based or other types of devices that may operate in an approximately 70 kelvin (~70 K) or above thermal environment. In addition, such systems may also include quantum computing devices that may operate at much lower temperatures, e.g., approximately 20 milli-kelvin (~20 mK). The quantum computing devices may process quantum information, e.g., qubits.

The present disclosure also relates to the use of a thermal load management system to transfer heat away from the HTS-based interconnects. In one example, the thermal load management system may include a thermal clamp that may allow for a coupling with a cold plate (coupled to a refrigeration system) to maintain the temperature of a region of the HTS-based interconnects at or below the HTS-based interconnects' critical temperature (e.g., between 60 kelvin to 92 kelvin). The transfer of heat via the thermal camp may ensure thermal insulation of the cryogenic environment from the devices operating in an environment having a temperature above the HTS-based interconnects' critical temperature. In addition, the HTS-based interconnects may include a metallic layer for the portions that interface with the non-cryogenic environment. The metallic layer (e.g., gold, silver, or copper) may minimize the electrical loss of the HTS-based interconnects for the portions that interface with the non-cryogenic environment. In addition, compared with conventional copper coaxial cables or stainless steel coaxial cables, HTS-based interconnects formed as a microstrip, a strip line, or a coplanar transmission line may permit the transmission of high-speed electrical signals over long distances with minimal loss. In addition, the physical cross section of such HTS-based interconnects may be small, so that large numbers of signals can be transmitted in a single flexible cable.

The superconducting logic devices may include superconductor logic circuits. Unlike CMOS transistors, the superconductor logic circuits may use Josephson junction based devices or other such device. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Such materials have zero DC resistance and very low resistance at the frequencies at which high-speed classical and quantum computing circuits operate (order of magnitude 10 GHz). In certain examples, microwave signals may be used to control the superconducting logic based devices including, for example, the state of superconducting quantum bits (qubits). Many implementations of the gates for superconducting quantum bits (qubits) may require high-frequency microwave signals.

When such superconducting logic based systems are connected to other types of logic based systems, such as systems based on CMOS devices, they need to be interconnected via high-speed communication links. In one example, such communication links may need to operate at 10-100 Gigabits per second (Gbits/s). In one example, a system operating in a cryogenic environment may require a vacuum to operate properly. In one example, a vacuum may relate to a pressure in a range of $10^{-3}$ Torr to $10^{-10}$ Torr. The HTS-based interconnects along with the other components described herein may be used to provide such high-speed communication links.

Examples described in this disclosure further relate to HTS-based interconnects for interconnecting modules operating in two different temperature environments (e.g., referred to as "cold" and "warm"). For a given DC electrical resistance, the heat leakage is set mainly by the Wiedemann-Franz law, which establishes a proportionality between electrical conductivity and thermal conductivity. Signal attenuation for high-frequency signals, however, is determined by the high-frequency electrical loss, which is typically much larger than the DC electrical loss in conventional cables. In order to achieve the best possible heat leakage, limited only by the Wiedemann-Franz law, one may need a cable where the DC electrical loss is comparable to the RF loss. This may require the conductors in the cable to be thin relative to the skin depth at the frequencies of interest (typically sub-micron dimensions at GHz frequencies).

Advantageously, compared with conventional copper coaxial cables and stainless steel coaxial cables, the HTS-based interconnects may support high signal density and high-speed electrical signals over long distances with minimal loss. In addition, such interconnects may allow for high speed continuous interconnection with low or no transduction and minimal thermal loading of the cryogenic environment because of the heat transfer from the 77 K region. Moreover, the HTS-based interconnects may not require the use of active electronics to achieve such advantages.

Figure 1:
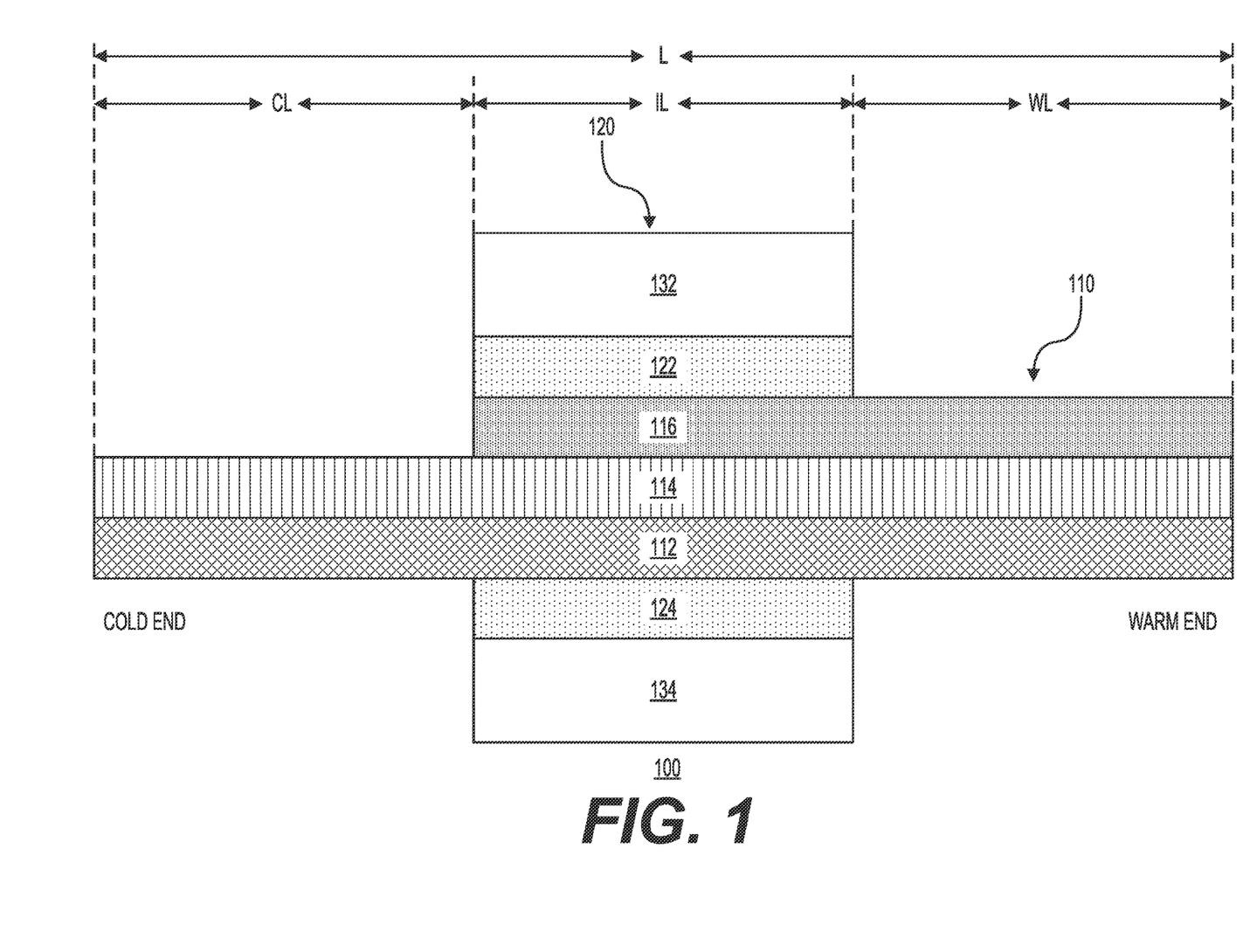
FIG. 1 shows a diagram of a high temperature superconductor (HTS)-based interconnect system with a lowered thermal load for use with cryogenic environments in accordance with one example.

FIG. 1 shows a diagram of a high temperature superconductor (HTS)-based interconnect system 100 with a lowered thermal load for use with cryogenic environments in accordance with one example. In this example, HTS-based interconnect system 100 may include an HTS-based interconnect 110 and a thermal load management system 120. HTS-based interconnect 110 may be used to interconnect components located toward the cold end (e.g., the end labeled as COLD END in FIG. 1) with the components located towards the warm end (e.g., the end labeled as WARM END in FIG. 1). In this example, HTS-based interconnect system 100 may be configured to interconnect superconducting logic based components that may operate in an approximately 10 kelvin (~10 K) or below thermal environment with CMOS-based or other types of devices that may operate in an approximately 70 kelvin (~70 K) or above thermal environment.

With continued reference to FIG. 1, in one example, HTS-based interconnect 110 may include a combination of materials that may vary along its entire length (labeled as L in FIG. 1). In one example, the entire length (L) of HTS-based interconnect 110 may include a substrate layer 112. In this example, the entire length (L) of HTS-based interconnect 110 may further include a high temperature superconductor layer 114 formed over substrate layer 112. Further, in this example, the portion of HTS-based interconnect 110 extending from the warm end to a cold plate (e.g., cold plate 132) (labeled as WL in FIG. 1) and the portion of HTS-based interconnect 110 interfacing with the cold plate (e.g., cold plate 132) (labeled as IL in FIG. 1) may include a metallic layer 116. No portion of metallic layer 116 may extend onto the portion of HTS-based interconnect 110 extending from the cold end to the cold plate (e.g., cold plate 132) (labeled as CL in FIG. 1). In one example, the portion HTS-based interconnect 110 labeled as IL may be viewed as an intermediate portion having two other portions extending towards two different ends (e.g., the portion of HTS-based interconnect 110 labeled as CL extending towards the cold end and the portion of HTS-based interconnect 110 labeled as WL extending towards the warm end).

In one example, substrate layer 112 may be formed using yttria-stabilized zirconia (YSZ). Alternatively, substrate layer 112 may be formed as a polyimide film, such as Kapton. In one example, substrate layer 112 may be 20 microns thick. As another example, the thickness of substrate layer 112 may range between 20 microns to 100 microns. Substrate layer 112 may include multiple layers, as well. As an example, YSZ may be coated on a glass substrate or another type of substrate to form substrate layer 112.

High temperature superconductor layer 114 may be formed using certain copper oxides or rare-earth (Re) metal compounds. As an example, high temperature superconductor layer 114 may be formed using yttrium barium copper oxides (YBCOs), bismuth strontium calcium copper oxides (BSCCOs), or rare-earth metal oxides (REBCOs). Other suitable high temperature superconductor materials that are superconducting at or above 77 K may also be used. In one example, high temperature superconductor layer 114 may have a thickness of 1 micron. In another example, the thickness of high temperature superconductor layer 114 may range between 1 micron to 5 micron. Metallic layer 116 may be formed using gold (Au), silver (Ag), or copper (Cu). In one example, metallic layer 116 may have a thickness of 0.25 microns. In another example, metallic layer 116 may have a thickness between 0.25 microns to 1 micron. In one example, high temperature superconductor layer 114 may be formed using chemical vapor deposition (CVD). Other similar processes may also be used.

Metallic layer 116 may allow for the transfer of a large amount of heat from HTS-based interconnect 110. This is because while substrate layer 112 is formed using YSZ, and thus may have a thermal conductivity of 1.5 Watts per meter kelvin (W/mK), metallic layer 116 may have a thermal conductivity of 430 W/mK if formed using silver or a thermal conductivity of 330 W/mK if formed using gold. In one example, metallic layer 116 may be formed using physical vapor deposition (PVD) or other similar processes.

Although FIG. 1 shows high temperature superconductor layer 114 formed over an entire length of substrate layer 112, including as being formed in the portion of HTS-interconnect 110 having metallic layer 116, high temperature superconductor layer 114 may not be formed in the portion of HTS-interconnect 110 having metallic layer 116. Alternatively, high temperature superconductor layer 114 may be formed only in a sub-portion (from no portion to approximately the entire portion) of the portion of HTS-interconnect 110 having metallic layer 116. As an example, the extent of the overlap between high temperature superconducting layer 114 and metallic layer 116 may need to be sufficient to ensure that high temperature superconducting layer 114 is cooled to a temperature at which it is superconducting (e.g., 77 K) or below. Although FIG. 1 shows metallic layer 116 formed over an entirety of the portion of HTS-interconnect 110 identified as the portion labeled as IL, metallic layer 116 need not be formed over the entirety of this portion. Instead, as noted above, the overlap between metallic layer 116 and high temperature superconducting layer 114 may need to be sufficient to ensure that high temperature superconducting layer 114 is cooled to a temperature at which it is superconducting (e.g., 77 K) or below.

Still referring to FIG. 1, in one example, thermal load management system 120 may be configured to maintain at least a portion of HTS-based interconnect at an intermediate temperature (e.g., 77 K) in relation to the temperature at the cold end (e.g., 10 K or lower) and in relation to the temperature at the warm end (e.g., 223 K or higher). In one example, thermal load management system 120 may include a thermal clamp including a cold plate 132 and a clamp 134. Cold plate 132 may be coupled with a top portion (e.g., the portion of HTS-based interconnect 110 corresponding to the length of cold plate 132, labeled as IL in FIG. 1) HTS-based interconnect 110 to remove heat from HTS-based interconnect 110. Clamp 134 may be configured to hold cold plate 132 in place. Cold plate 132 may be coupled to a refrigeration system (not shown in FIG. 1). The length of cold plate 132 (corresponding to the portion labeled as IL in FIG. 1) may be determined using the extent of heat transfer required. As explained above, metallic layer 116 may have a thermal conductivity of 430 W/mK or 330 W/mK. Assuming, as part of one example, the warm end is at a temperature of 233 K and the cold plate needs to be maintained at 77 K, then metallic layer 116 may be required to transfer enough heat to maintain the 156 K difference in temperature. Assuming HTS-based interconnect 110 includes one-thousand pairs for wires for differential signaling, an estimate may be derived for the amount of refrigeration needed for maintaining the temperature of the cold plate at approximately 77 K. This example assumes that the length of the portion including metallic layer 116 that extends beyond the cold plate (e.g., cold plate 132) towards the warm end has a length of 20 mm (labeled as WL in FIG. 1). This example further assumes a thickness of 0.5 micron and a width of 60 microns for each of the one-thousand pairs of wires. In this example for a silver-based metallic layer 116, the amount of heat that may need to be transferred may equal approximately 101 mW= (430 W/mK×0.5 μm×60 μm×1000 pairs)/(20 mm). In this example, for a gold-based metallic layer 116, the amount of heat that may need to be transferred may equal approximately 77 mW=(330 W/mK×0.5 μm×60 μm×1000 pairs)/ (20 mm). Additional heat may need to be transferred from the substrate layer 112 and high-temperature superconductor layer 114. The total amount of the refrigeration may be obtained by summing of the total amount of the heat that may be transferred via the cold plate (e.g., cold plate 132).

In this example, an insulator 122 may be located between a top surface of metallic layer 116 of HTS-based interconnect 110 and a bottom surface of cold plate 132. Another insulator 124 may be located between a bottom surface of substrate 112 and a top surface of clamp 134. Each of the insulators 122 and 124 may be made of a material that provides electrical insulation between HTS-based interconnect 110 and cold plate 132 or clamp 134, and yet is an effective thermal conductor. Example materials for forming insulators 122 and 124 include Teflon, sapphire, diamond, or another material or combination of materials to maintain electrical isolation and yet provide effective heat transfer. Although FIG. 1 shows HTS-based interconnect system 100 as including a certain number of components arranged in a certain manner, HTS-based interconnect system 100 may include additional or fewer components, arranged differently. As an example, instead of cold plate 132, a heat pipe may be coupled to insulator 122 to remove the heat from HTS-based interconnect 110. The heat pipe may be configured to use liquid nitrogen or some other liquefied gas to remove the heat away from insulator 122 and thus allow one to maintain the temperature of a portion (e.g., the portion of HTS-based interconnect labeled as IL in FIG. 1) of HTS-based interconnect 110 at the desired set point (e.g., 77 K).

Figure 2:
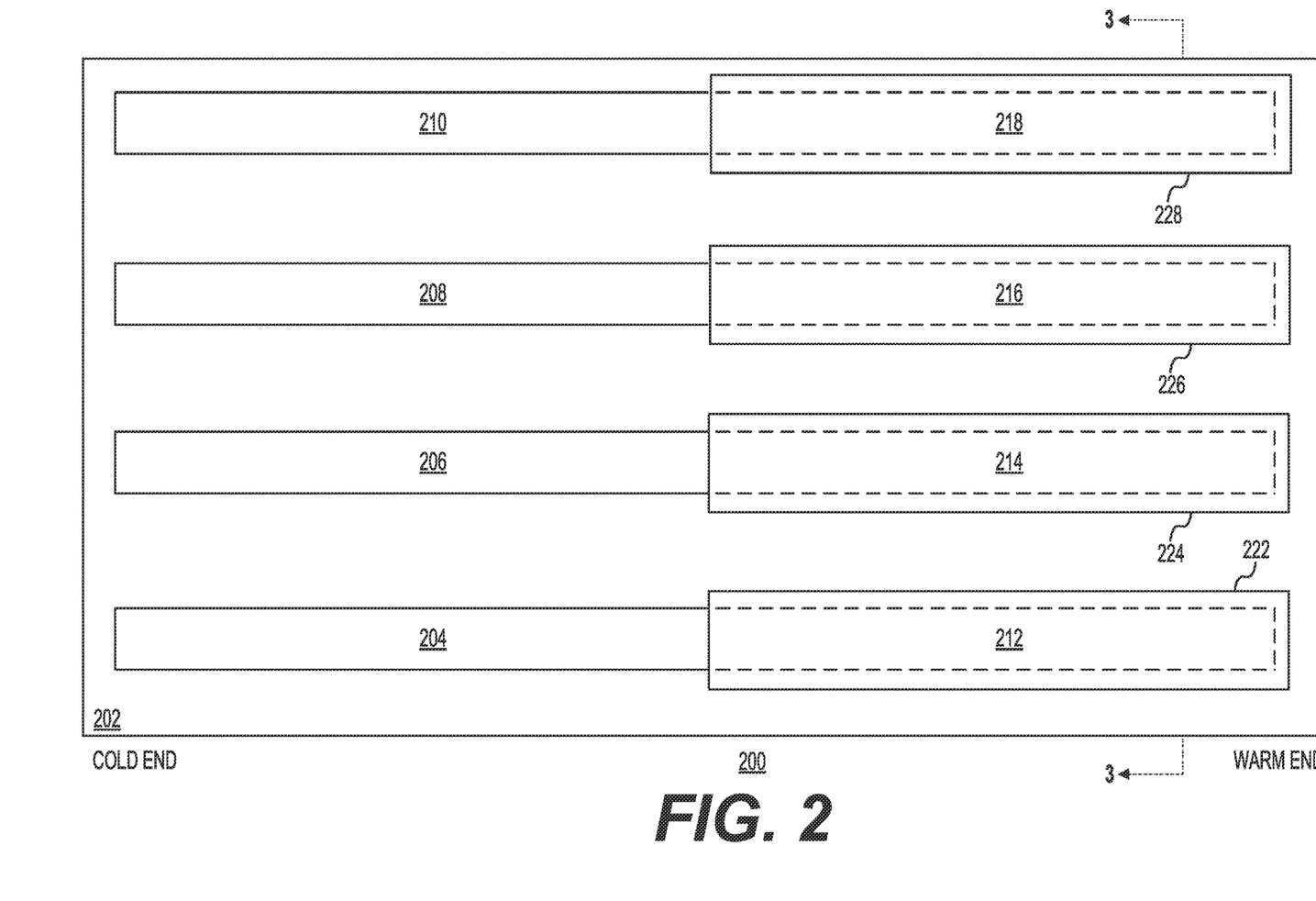
FIG. 2 shows a top view of the HTS-based interconnect of FIG. 1 in accordance with one example.

FIG. 2 shows a top view 200 of the HTS-based interconnect 110 of FIG. 1 in accordance with one example. Top view 200 shows substrate layer 202 at the bottom, which corresponds to substrate layer 112 of FIG. 1. Each of high temperature superconductor layers 204, 206, 208, and 210 correspond to high temperature superconductor layer 114 of FIG. 1. Each of metallic layers 222, 224, 226, and 228 correspond to metallic layer 116 of FIG. 1. Portions 212, 214, 216, and 218 (shown via dotted lines) are the portions of high temperature superconductor layers 204, 206, 208, and 210 that are below a respective metallic layer. Top view 200 shows interspersed signaling and ground interconnect wires. In this example, high temperature superconductor layers 204 and 210 and corresponding metallic layers 212 and 218 may be configured to carry ground signals (e.g., Gd and Gd). Moreover, in this example, high temperatures superconductor layers 206 and 208 and corresponding metallic layers 214 and 216 may be configured to carry differential signals (e.g., S+ may be carried by the layers 206 and 214 and S− may be carried by the layers 208 and 216). The width of the wires may be configured such that the width of the wires carrying the ground signals may be different from the width of the wires carrying the differential signals. In one example, the pitch of a differential pair of wires, including the signal wires and the ground wires may be 270 microns. This example assumes that each of the wires carrying the ground signals has a width of 30 microns, each of the wires carrying S+ or S− signals has a width of 15 microns, and each of the spacing between the wires is 70 microns. Other pitch values based on a different width of the wires and a different spacing may also be used for HTS-based interconnect 110. Although FIG. 2 shows top view 200 of HTS-based interconnect 110 as including a certain arrangement of layers and wires, other arrangements may also be used.

Figure 3:
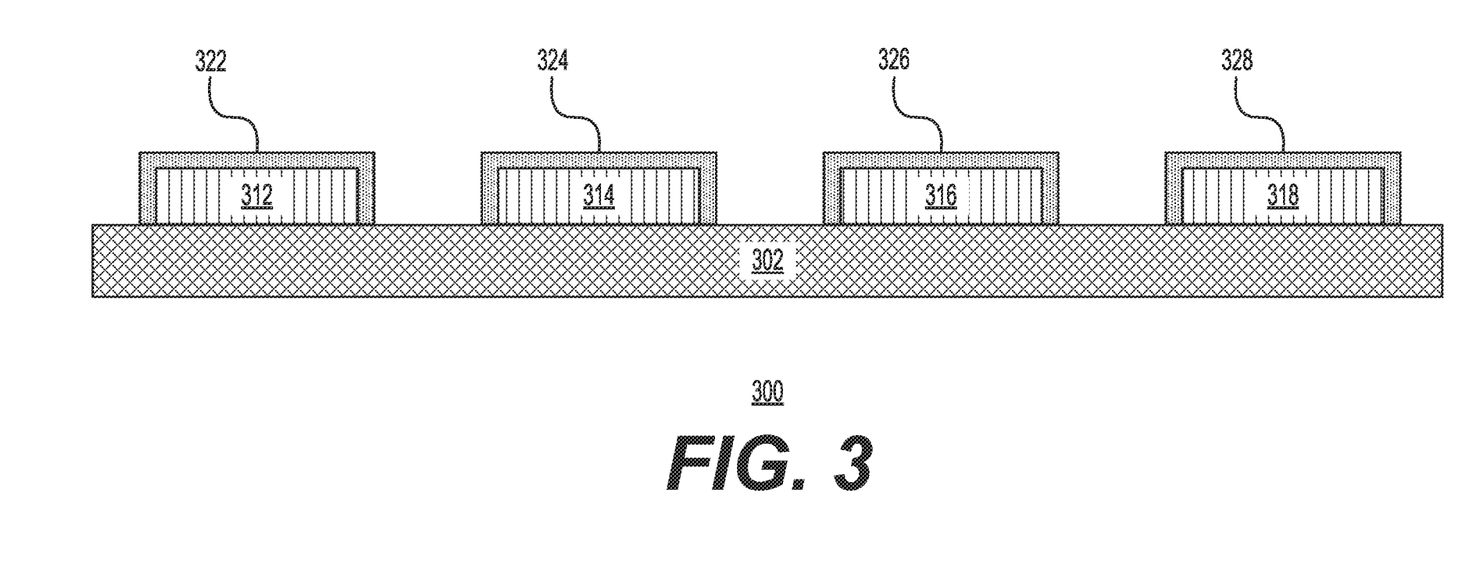
FIG. 3 shows a cross-section view of the HTS-based interconnect of FIG. 1 in accordance with one example.

FIG. 3 shows a cross-section view 300 of the HTS-based interconnect 110 of FIG. 1 and FIG. 2 in accordance with one example. Cross-section view 300 corresponds to looking at a cross-section along the length of the HTS-based interconnect in a plane identified as 3-3 in FIG. 2. Cross-section view 300 shows substrate layer 302 at the bottom, which corresponds to substrate layer 112 of FIG. 1. Each of high temperature superconductor layers 312, 314, 316, and 318 correspond to high temperature superconductor layer 114 of FIG. 1. Each of metallic layers 322, 324, 326, and 328 correspond to metallic layer 116 of FIG. 1. Although FIG. 3 shows cross-section view 300 of HTS-based interconnect 110 as including a certain arrangement of layers and wires, other arrangements may also be used.

Figure 4:
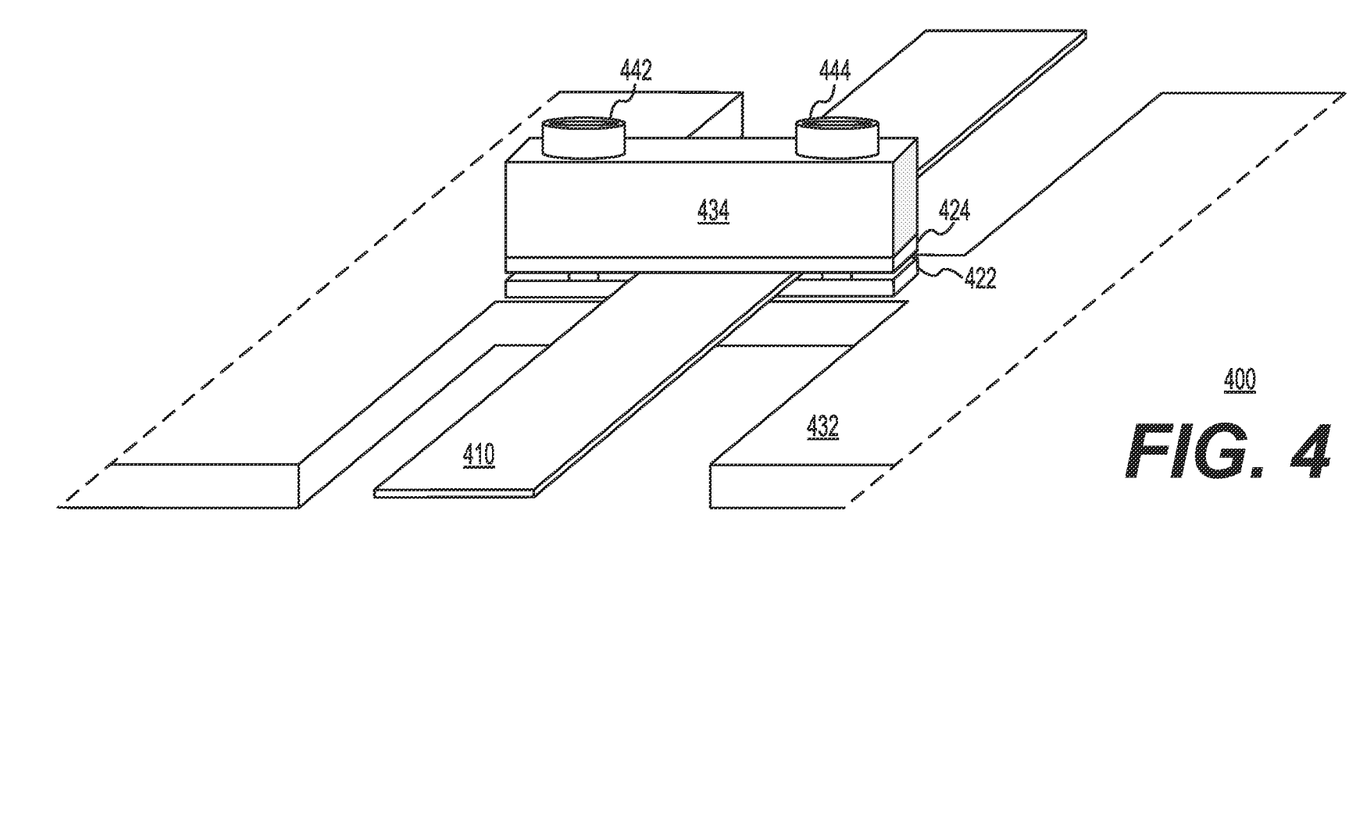
FIG. 4 shows a diagram of one example implementation of a high temperature superconductor (HTS)-based interconnect system with a lowered thermal load for use with cryogenic environments.

FIG. 4 shows one example implementation of a high temperature superconductor (HTS)-based interconnect system 400 with a lowered thermal load for use with cryogenic environments. In this example implementation, HTS-based interconnect 410 is shown as extending in two directions-one towards the warm end and the other towards the cold end (e.g., as shown in FIG. 1 with respect to HTS-based interconnect 110). Cold plate 432, which may correspond to cold plate 132, may be part of a thermal load management system to maintain at least a portion of HTS-based interconnect 410 at 77 K. An insulator 422 may be located between a surface of HTS-based interconnect 410 having the metallic layer and a top surface of cold plate 432. Another insulator 424 may be located between a surface of HTS-based interconnect 410 having the substrate layer and a bottom surface of clamp 434. Screws 442 and 444 may be used along with corresponding nuts to maintain the clamp 434 in close contact with cold plate 432. Each of the insulators 422 and 424 may be made of a material that provides electrical insulation between HTS-based interconnect 410 and cold plate 432 or clamp 434, and yet is an effective thermal conductor. Example materials for forming the insulators are described with respect to FIG. 1. As explained earlier, cold plate 432 may be coupled to a refrigeration system to maintain the temperature of the cold plate at a desired setpoint (e.g., 77 K). Although FIG. 4 shows HTS-based interconnect system 400 as including a certain number of components arranged in a certain manner, HTS-based interconnect system 400 may include additional or fewer components, arranged differently. As an example, instead of cold plate 432, a heat pipe may be coupled to insulator 422 to remove the heat from HTS-based interconnect 410. The heat pipe may be configured to use liquid nitrogen or some other liquefied gas to remove the heat away from insulator 422 and thus allow one to maintain the temperature at the desired set point (e.g., 77 K).

Figure 5:
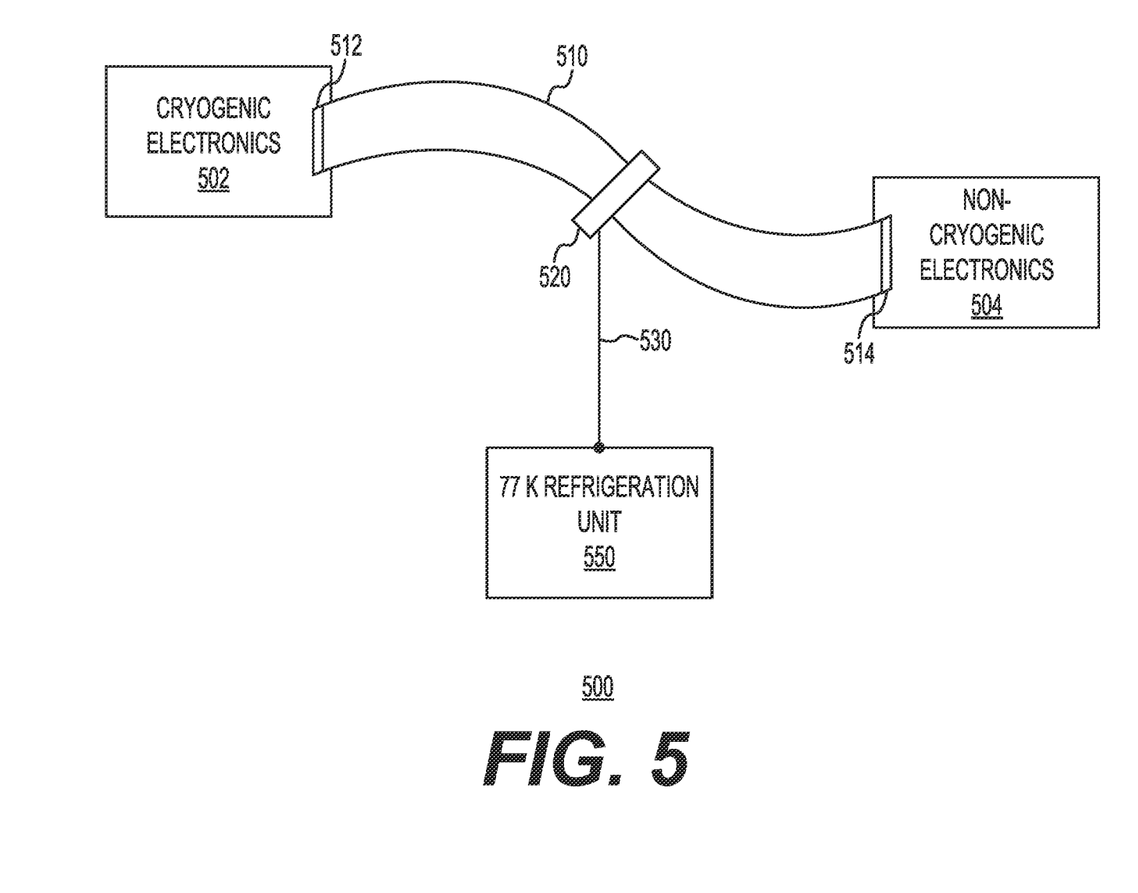
FIG. 5 shows a diagram of a high temperature superconductor (HTS)-based interconnect system with a lowered thermal load for use with cryogenic environments in accordance with another example.

FIG. 5 shows a high temperature superconductor (HTS)-based interconnect system 500 with a lowered thermal load for use with cryogenic environments in accordance with another example. HTS-based interconnect system 500 may include cable 510 including HTS-based interconnects (e.g., interconnects similar to HTS-based interconnect 110 of FIG. 1). One end of cable 510 may be connected to cryogenic electronics 502 towards the cold end (e.g., approximately at 4 K) via soldering or other techniques for bonding cables, such as flip-chip bonding techniques. In this example, a solder joint 512 is shown for connecting cable 510 to cryogenic electronics 502. Cryogenic electronics 502 may be housed in a housing capable of maintaining a cryogenic environment. In one example, cryogenic electronics 502 operating in a cryogenic environment may not only require an environment with temperature at or below 10 K, but also require a vacuum to operate properly. In one example, a vacuum may relate to a pressure in a range of $10^{-3}$ Torr to $10^{-10}$ Torr. Cryogenic electronics 502 may include qubits operating at 20 mK or lower and other superconducting components (e.g., multi-chip modules or printed circuit board circuits) operating at 10 K or below. Cryogenic electronics 502 may include electronics corresponding to quantum computers, communication equipment, or medical equipment (e.g., magnetic resonance imaging (MRI) machines). The other end of cable 510 may be connected to non-cryogenic electronics 504 (e.g., CMOS-based electronics) towards the warm end (e.g., approximately at 233 K) via soldering or other techniques for bonding cables, such as flip-chip bonding techniques. In this example, a solder joint 514 is shown for connecting cable 510 to non-cryogenic electronics 504. Advantageously, the use of cable 510 including HTS-based interconnects may eliminate the need for converting electrical signals into optical signals or other signals having a frequency different from the differential signals being carries by the HTS-based interconnects. In this way, high speed continuous interconnection may be realized between cryogenic electronics 502 and non-cryogenic electronics 504 without active electronics and minimal thermal loading of the cryogenic electronics.

With continued reference to FIG. 5, HTS-based interconnect system 500 may further include a thermal load management system. In this example, the thermal load management system may include a thermal clamp 520, a physical connection 530, and a 77 K refrigeration unit 550. Clamp 520 may be connected at an intermediate point of cable 510 as shown in FIG. 5. Thermal clamp 520 may be any of the thermal clamps described earlier. The other end of thermal clamp 520 may be connected to a refrigeration unit 550 (via a cold plate or a heat pipe, as described earlier) via a physical connector 530. 77 K refrigeration unit 550 may be configured to maintain the temperature of cable 510 corresponding to the portion clamped by thermal clamp 520 at approximately a temperature of 77 K. The physical connector 530 interconnecting the thermal clamp site and the cold plate may be implemented as a Copper wire, braid, or foil or as a liquid Helium heat pipe. Although FIG. 5 shows HTS-based interconnect system 500 as including a certain number of components arranged in a certain manner, HTS-based interconnect system 500 may include additional or fewer components, arranged differently. As an example, although FIG. 5 describes 77 K refrigeration unit 550 configured to maintain the temperature of cable 510 corresponding to the portion clamped by thermal clamp 520 at approximately a temperature of 77 kelvin, 77 K refrigeration unit 550 may be configured to maintain the temperature anywhere between a temperature of 60 kelvin to 92 kelvin. In one example, 77 K refrigeration unit 550 may be configured to maintain the temperature that is the same or substantially the same as the HTS-based interconnect's critical temperature.

In conclusion, in one example, the present disclosure relates to a high temperature superconductor (HTS)-based interconnect system comprising a cable including a plurality of HTS-based interconnects for interconnecting cryogenic electronics with non-cryogenic electronics. Each of the plurality of HTS-based interconnects may include a first portion extending from a first end towards an intermediate portion and a second portion extending from the intermediate portion to a second end, opposite to the first end. Each of the plurality of HTS-based interconnects may include a substrate layer formed in the first portion, in the intermediate portion, and in the second portion, a high temperature superconductor layer formed over the substrate layer in at least a sub-portion of the first portion, in the intermediate portion, and in the second portion, and a metallic layer formed over the high temperature superconductor layer in the first portion and in at least a sub-portion of the intermediate portion. The HTS-based interconnect system may further include a thermal load management system comprising at least one heat transfer element coupled to the intermediate portion of each of the plurality of HTS-based interconnects. The thermal load management system may be configured to maintain the intermediate portion of each of the plurality of HTS-based interconnects at a predetermined temperature in a range between a temperature of 60 kelvin and 92 kelvin.

The substrate layer may comprise at least one of yttria-stabilized zirconia (YSZ) or a polyimide. The high temperature superconductor layer comprises at least one of yttrium barium copper oxides (YBCOs), bismuth strontium calcium copper oxides (BSCCOs), or rare-earth metal oxides (REBCOs). The metallic layer may comprise at least one of gold (Au), silver (Ag), or copper (Cu).

The cryogenics electronics may be configured to operate in a cryogenic environment including a temperature at or below 10 kelvin and a vacuum having a pressure in a range of $10^{-3}$ Torr to $10^{-10}$ Torr. The heat transfer element may comprise a thermal clamp. The thermal clamp may be configured to clamp a cold plate or a heat pipe to the intermediate portion of each of the plurality of HTS-based interconnects, and wherein the cold plate or the heat pipe is coupled to a refrigeration unit.

In another example, the present disclosure relates to high temperature superconductor (HTS)-based interconnect for interconnecting cryogenic electronics with non-cryogenic electronics. The HTS-based interconnect may include a first portion extending from a first end towards an intermediation portion and a second portion extending from the intermediate portion to a second end, opposite to the first end. The HTS-based interconnect may further include a substrate layer formed in the first portion, in the intermediate portion, and in the second portion, a high temperature superconductor layer formed over the substrate layer in at least a sub-portion of the first portion, in the intermediate portion, and in the second portion, and a metallic layer formed over the high temperature superconductor layer in the first portion and in at least a sub-portion of the intermediate portion.

The substrate layer may comprise at least one of yttria-stabilized zirconia (YSZ) or a polyimide. The high temperature superconductor layer comprises at least one of yttrium barium copper oxides (YBCOs), bismuth strontium calcium copper oxides (BSCCOs), or rare-earth metal oxides (REBCOs). The metallic layer may comprise at least one of gold (Au), silver (Ag), or copper (Cu).

The cryogenic electronics may be configured to operate in a cryogenic environment including a temperature at or below 10 kelvin and a vacuum having a pressure in a range of $10^{-3}$ Torr to $10^{-10}$ Torr.

In yet another example, the present disclosure relates to a high temperature superconductor (HTS)-based interconnect system comprising a cable including a plurality of HTS-based interconnects for directly interconnecting cryogenic electronics with non-cryogenic electronics such that differential signals are transferrable to or from a first end of the cable to a second end, opposite to the first end, of the cable without converting a form of the differential signals. Each of the plurality of HTS-based interconnects may include a first portion extending from the first end towards an intermediate portion and a second portion extending from the intermediate portion to the second end. Each of the plurality of HTS-based interconnects may comprise a substrate layer formed in the first portion, in the intermediate portion, and in the second portion, a high temperature superconductor layer formed over the substrate layer in at least a sub-portion of the first portion, in the intermediate portion, and in the second portion, and a metallic layer formed over the high temperature superconductor layer in the first portion and in at least a sub-portion of the intermediate portion. The HTS-based interconnect system may further include a thermal load management system comprising at least one heat transfer element coupled to the intermediate portion of each of the plurality of HTS-based interconnects. The thermal load management system may be configured to maintain the intermediate portion of each of the plurality of HTS-based interconnects at a predetermined temperature in a range between a temperature of 60 kelvin and 92 kelvin.

The substrate layer may comprise at least one of yttria-stabilized zirconia (YSZ) or a polyimide. The high temperature superconductor layer comprises at least one of yttrium barium copper oxides (YBCOs), bismuth strontium calcium copper oxides (BSCCOs), or rare-earth metal oxides (REBCOs). The metallic layer may comprise at least one of gold (Au), silver (Ag), or copper (Cu).

The heat transfer element may comprise a thermal clamp. The thermal clamp may be configured to clamp a cold plate or a heat pipe to the intermediate portion of each of the plurality of HTS-based interconnects. The cold plate or the heat pipe may be coupled to a refrigeration unit.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a system, or any other implementation of a functionality, is described herein as being coupled to another component does not mean that the components are necessarily separate components. As an example, a component A described as being coupled to another component B may be a sub-component of the component B, or the component B may be a sub-component of the component A.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, JMRAM, SRAM, a cache, or other such media. Non-transitory media is distinct from, but can be used in conjunction with, transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A high temperature superconductor (HTS)-based interconnect system comprising:
  a cable including a plurality of HTS-based interconnects for interconnecting cryogenic electronics with non-cryogenic electronics, wherein the cryogenic electronics is configured to operate in a cryogenic environment including a temperature at or below 10 kelvin and a vacuum having a pressure in a range of $10^{-3}$ Torr to $10^{-10}$ Torr, wherein each of the plurality of HTS-based interconnects includes a first portion extending from a first end towards an intermediate portion and a second portion extending from the intermediate portion to a second end, opposite to the first end, and wherein each of the plurality of HTS-based interconnects comprises:
    a substrate layer formed in the first portion, in the intermediate portion, and in the second portion,
    a high temperature superconductor layer formed over the substrate layer in at least a sub-portion of the first portion, in the intermediate portion, and in the second portion,
    a metallic layer formed over the high temperature superconductor layer, in the first portion and in at least a sub-portion of the intermediate portion; and
  a thermal load management system comprising at least one heat transfer element coupled to the intermediate portion of each of the plurality of HTS-based interconnects, wherein the thermal load management system is configured to maintain the intermediate portion of each of the plurality of HTS-based interconnects at a predetermined temperature in a range between a temperature of 60 kelvin and 92 kelvin, wherein the heat transfer element comprises a thermal clamp, and wherein the thermal clamp is configured to clamp a cold plate or a heat pipe to the intermediate portion of each of the plurality of HTS-based interconnects, and wherein the cold plate or the heat pipe is coupled to a refrigeration unit.

2. The HTS-based interconnect system of claim 1, wherein the substrate layer comprises at least one of yttria-stabilized zirconia (YSZ) or a polyimide.

3. The HTS-based interconnect system of claim 1, wherein the high temperature superconductor layer comprises at least one of yttrium barium copper oxides (YBCOs), bismuth strontium calcium copper oxides (BSCCOs), or rare-earth metal oxides (REBCOs).

4. The HTS-based interconnect system of claim 1, wherein the metallic layer comprises at least one of gold (Au), silver (Ag), or copper (Cu).

5. The HTS-based interconnect system of claim 1, wherein each of the plurality of HTS-based interconnects comprises a first set of wires configured to carry differential signals.

6. The HTS-based interconnect system of claim 5, wherein each of the plurality of HTS-based interconnects comprises a second set of wires, different from the first set of wires, configured to carry ground signals.

7. The HTS-based interconnect system of claim 6, wherein the first set of wires and the second set of wires are arranged in an interspersed manner.

8. A system comprising:
a thermal load management system; and
a high temperature superconductor (HTS)-based interconnect for interconnecting cryogenic electronics with non-cryogenic electronics wherein the cryogenic electronics is configured to operate in a cryogenic environment including a temperature at or below 10 kelvin and a vacuum having a pressure in a range of $10^{-3}$ Torr to $10^{-10}$ Torr, the HTS-based interconnect comprising a first portion extending from a first end towards an intermediate portion and a second portion extending from the intermediate portion to a second end, opposite to the first end, and wherein the HTS-based interconnect further comprises:
a substrate layer formed in the first portion, in the intermediate portion, and in the second portion,
a high temperature superconductor layer formed over the substrate layer in at least a sub-portion of the first portion, in the intermediate portion, and in the second portion, and
a metallic layer formed over the high temperature superconductor layer in the first portion and in at least a sub-portion of the intermediate portion, wherein the thermal management comprises at least one heat transfer element coupled to the intermediate portion of the HTS-based interconnect, wherein the thermal load management system is configured to maintain the intermediate portion of each of the plurality of HTS-based interconnects at a predetermined temperature in a range between a temperature of 60 kelvin and 92 kelvin, wherein the heat transfer element comprises a thermal clamp, and wherein the thermal clamp is configured to clamp a cold plate or a heat pipe to the intermediate portion of each of the plurality of HTS-based interconnects, and wherein the cold plate or the heat pipe is coupled to a refrigeration unit.

9. The system of claim 8, wherein the substrate layer comprises at least one of yttria-stabilized zirconia (YSZ) or a polyimide.

10. The system of claim 8, wherein the high temperature superconductor layer comprises at least one of yttrium barium copper oxides (YBCOs), bismuth strontium calcium copper oxides (BSCCOs), or rare-earth metal oxides (REBCOs).

11. The system of claim 8, wherein the metallic layer comprises at least one of gold (Au), silver (Ag), or copper (Cu).

12. The system of claim 8, wherein the HTS-based interconnect comprises a first set of wires configured to carry differential signals and a second set of wires, different from the first set of wires, is configured to carry ground signals.

13. The system of claim 12, wherein the first set of wires and the second set of wires are arranged in an interspersed manner.

14. A high temperature superconductor (HTS)-based interconnect system comprising:
a cable including a plurality of HTS-based interconnects for directly interconnecting cryogenic electronics with non-cryogenic electronics such that differential signals are transferrable to or from a first end of the cable to a second end, opposite to the first end, of the cable without converting a form of the differential signals, wherein the cryogenic electronics is configured to operate in a cryogenic environment including a temperature at or below 10 kelvin and a vacuum having a pressure in a range of $10^{-3}$ Torr to $10^{-10}$ Torr, wherein each of the plurality of HTS-based interconnects includes a first portion extending from the first end towards an intermediate portion and a second portion extending from the intermediate portion to the second end, and wherein each of the plurality of HTS-based interconnects comprises:
a substrate layer formed in the first portion, in the intermediate portion, and in the second portion,
a high temperature superconductor layer formed over the substrate layer in at least a sub-portion of the first portion, in the intermediate portion, and in the second portion, and
a metallic layer formed over the high temperature superconductor layer in the first portion and in at least a sub-portion of the intermediate portion; and
a thermal load management system comprising at least one heat transfer element coupled to the intermediate portion of each of the plurality of HTS-based interconnects, wherein the thermal load management system is configured to maintain the intermediate portion of each of the plurality of HTS-based interconnects at a predetermined temperature in a range between a temperature of 60 kelvin and 92 kelvin, wherein the heat transfer element comprises a thermal clamp, wherein the thermal clamp is configured to clamp a cold plate or a heat pipe to the intermediate portion of each of the plurality of HTS-based interconnects, and wherein the cold plate or the heat pipe is coupled to a refrigeration unit.

15. The HTS-based interconnect system of claim 14, wherein the substrate layer comprises at least one of yttria-stabilized zirconia (YSZ) or a polyimide.

16. The HTS-based interconnect system of claim 14, wherein the high temperature superconductor layer comprises at least one of yttrium barium copper oxides (YBCOs), bismuth strontium calcium copper oxides (BSCCOs), or rare-earth metal oxides (REBCOs).

17. The HTS-based interconnect system of claim 14, wherein the metallic layer comprises at least one of gold (Au) or silver (Ag).

18. The HTS-based interconnect system of claim 14, wherein each of the plurality of HTS-based interconnects comprises a first set of wires configured to carry differential signals.

19. The HTS-based interconnect system of claim 18, wherein each of the plurality of HTS-based interconnects comprises a second set of wires, different from the first set of wires, configured to carry ground signals.

20. The HTS-based interconnect system of claim 19, wherein the first set of wires and the second set of wires are arranged in an interspersed manner.

\* \* \* \* \*